United States Patent [19]
Roustaei

[11] Patent Number: 5,532,467
[45] Date of Patent: Jul. 2, 1996

[54] OPTICAL SCANNING HEAD

[76] Inventor: Alex Roustaei, 1696 Via Inspirar, San Marcos, Calif. 92069

[21] Appl. No.: 307,911

[22] Filed: Sep. 16, 1994

Related U.S. Application Data

[63] Continuation of Ser. No. 956,646, Oct. 2, 1992, Pat. No. 5,349,172, which is a continuation-in-part of Ser. No. 843,266, Feb. 27, 1992, Pat. No. 5,291,009.

[51] Int. Cl.⁶ .................................................. G06K 7/10
[52] U.S. Cl. .......................................... 235/472; 235/455
[58] Field of Search ..................................... 235/472, 455

[56] References Cited

U.S. PATENT DOCUMENTS

| | | | |
|---|---|---|---|
| 4,315,245 | 2/1982 | Nakahara | 235/455 |
| 4,818,886 | 4/1989 | Drucker | 235/472 |
| 5,258,605 | 11/1993 | Metlitsky | 235/455 |
| 5,354,977 | 10/1994 | Roustaei | 235/472 |

*Primary Examiner*—Harold Pitts
*Attorney, Agent, or Firm*—Brown, Martin, Haller & McClain

[57] ABSTRACT

The optical scanning head includes at least one trio of light emitting diodes arranged so the LEDs emit light at different angles to create a fan of light. An optical module includes a light shield or "dark room" and a lens/filter assembly which provides control of the depth of focus of the scanner. The optical module is located behind the light source, and the detector, made up of a CCD array is mounted behind the optic module for detecting the light intensity in the reflected beam over a field of view across a bar code symbol. The CCD array generates an electrical signal indicative of the detected light intensity. A DC source or battery provides DC voltage to the LEDs and CCDs in response to a clocked signal which provides a gradual or sequential illumination of the LEDs and coordinates the activation of the CCDs in order to minimize power consumption during scans.

26 Claims, 7 Drawing Sheets

OPTICAL SCANNING HEAD

This is a continuation of application Ser. No. 07/956,646, filed Oct. 2, 1992, now U.S. Pat. No. 5,349,172 of application Ser. No. 07/843,266, filed Feb. 27, 1992, now U.S. Pat. No. 5,291,009.

FIELD OF THE INVENTION

The invention generally relates to a scanning system for reading and/or analyzing bar code symbols and more particularly, to a portable bar code scanner.

BACKGROUND OF THE INVENTION

Many industries, including the assembly processing grocery and food processing industries, utilize an identification system in which the products are marked with a bar code symbol consisting of a series of lines and spaces of varying widths. A number of different bar code readers and laser scanning systems have been developed to decode the symbol pattern to a multiple digit representation for inventory, production tracking, and for check out or sales purposes. Optical scanners are available in a variety of configurations, some of which are built into a fixed scanning station and others of which are portable. The portability of an optical scanning head provides a number of advantages, including the ability to inventory products on shelves and to track portable items such as files or small equipment. A number of these portable scanning heads incorporate laser diodes which permit the user to scan the bar code symbols at variable distances from the surface on which the bar code is imprinted. A disadvantage of laser scanners is that they are expensive to manufacture.

Another type of bar code scanner which can be incorporated into a portable system uses light emitting diodes (LED) as a light source and charge couple devices (CCD) as detectors. This class of bar code scanners is generally known as "CCD scanners". While CCD scanners have the advantage of being less expensive to manufacture, they limit the user to scanning the bar code by either contacting the surface on which the bar code is imprinted or maintaining a distance of no more than one and one-half inches away from the bar code, which creates a further limitation in that it cannot read a bar code any longer than the window or housing width of the scanning head. Thus, the CCD scanner does not provide the comfort or versatility of the laser scanner which permits variable distance scanning of bar code symbols which may be wider than the window or housing width.

SUMMARY OF THE INVENTION

It is an advantage of the present invention to provide an optical scanning head for reading bar code symbols at variable distances from the symbol which uses LED light sources and CCD detectors.

It is a further advantage of the present invention to provide a CCD scanner which permits measurement of bar code symbols which are greater than the window or housing width of the scanner.

In an exemplary embodiment, the optical scanning head comprises at least one trio of light emitting diodes arranged in a generally "V" shaped configuration with each of the LEDs being oriented to emit light at different angles so that a fan of light is created. The number of LEDs can be any multiple of three, up to twenty-four (24), i.e., from one to eight trios. The trios themselves can be grouped to form, for example, two sextets or one group of twelve. An optical module includes a light shield or "dark room" and a lens/filter assembly which provides control of the depth of focus of the scanner. The optical module is located behind the light source, and the detector, made up of a CCD array is mounted behind the optic module for detecting the light intensity in the reflected beam over a field of view across a bar code symbol. The CCD array generates an electrical signal indicative of the detected light intensity. This signal is conveyed to a signal converter consisting of an analog filter and analog-to-digital conversion circuitry to filter noise and digitize the analog signal to generate data descriptive of the bar code symbol. An automatic gain control is provided to adjust the magnitude of the received signal to a pre-determined level, regardless of the distance between the bar code and the scanner. A light transmissive window is positioned in front of the LEDs. The window may include a filter and/or anti-reflection coating.

In an alternate embodiment, a generally straight row of LEDs is provided to create a uniformly illuminated fan of light. The fan of light is created by orienting the LEDs at different angles, with the outer LEDs being angled more toward the outside.

The optical scanning head is powered by a D.C. source or battery, preferably rechargeable, which provides DC voltage to the LEDs and CCDs in response to a clocked signal which provides a gradual, serial illumination of the LEDs and coordinates the activation of the CCDs in order to minimize power consumption during scans. Alternatively, the voltage supplied to the LEDs can be modulated in response to the level of the signal produced by the CCDs. If a bar code is scanned at close range, a lower level of light will provide a strong signal. However, at greater distances from the bar code, higher light intensity is necessary to achieve a good quality signal at the CCDs. Power is conserved in the latter version by not providing full power to the LEDs unless necessary.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
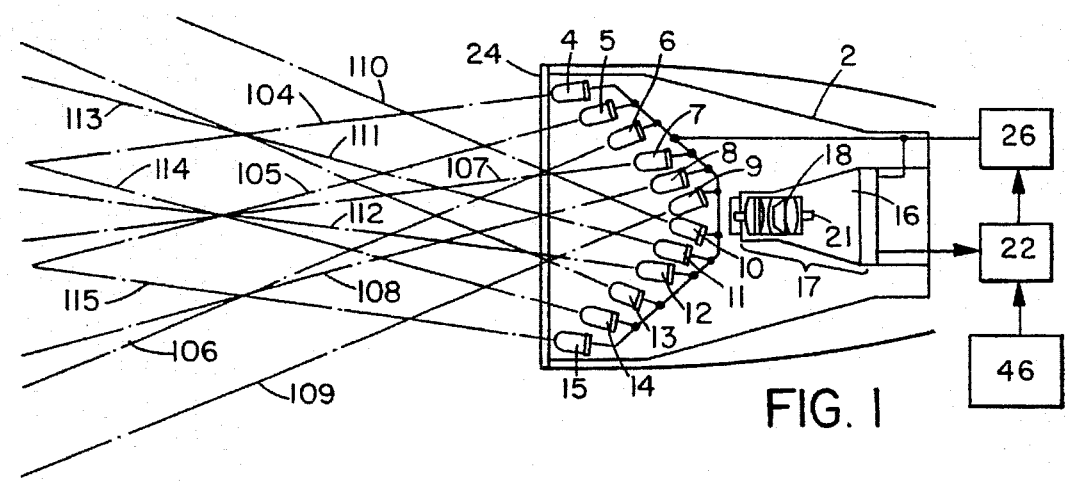
FIG. 1 is a diagrammatic view of the relative layout of the LEDs, optical module, and detector on a printed circuit board.

The scanning head module illustrated in FIG. 1 comprises the printed circuit board (PCB) 2 configured as a generally "U"- or "Y"-shaped surface onto which is mounted one or more trios of LEDs (from 3 to 24 individual LEDs) configured in a generally V-shaped pattern in an orientation that results in projection of a light ray by one LED in a direction distinct from other LEDs in the trio. The configuration illustrated in FIG. 1 has 12 LEDs identified as LEDs 4 through 15, which emanate rays of light 104 through 115. The portion of printed circuit board 2 from which LED light emanates will be considered the front of the board. At the approximate center of board, behind the LEDs, an optical module 17 consisting of a light shield (dark room 16), in which is contained lens assembly 18 which filters and focuses light reflected from a scanned bar code onto CCD detector 20, disposed behind the optical module at the rear of PCB 2. A signal generated by activation of the CCDs by the reflected light generates a signal which is conveyed to signal converter 22 which consists of an analog filter and an analog-to-digital circuit. Forward of the LEDs, either attached to the PCB 2 or mounted within a housing containing PCB 2, is window 24 which is light transmissive and provides filtering and positioning of the light path of the illuminating beam incident upon the bar code to be scanned then transmits the reflected light carrying the intensity modulated bar code signal back to the lens assembly and to the detector.

The scanning head may also include a decoder module 26 which decodes a multiple-digit representation of bar code symbols such as UPC, EAN, JAN, Code 39, Code 2/5I, Code 2/5, Code 128, Codabar, Plessey, and other bar code systems.

Figure 2A:
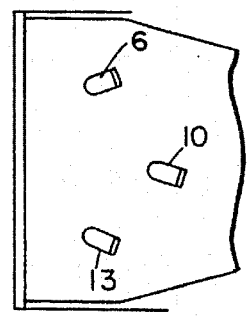
FIGS. 2a, 2b and 2c are diagrammatic views of relative locations of LEDs for one trio, two trios and three trios of LEDs, respectively.

The light source consisting of the trios of LEDs is illustrated in FIG. 1 as possessing 12 LEDs which are mounted in a generally V-shaped configuration relative to other LEDs so that they point outward at angles such that groupings of three on a single leg, e.g. LEDs 4, 5 and 6 or 13, 14 and 15 form substantially a single beam of light which expands at increased field depth. The actual grouping of the trios of LEDs is best illustrated in FIGS. 2a, b and c. From this it can be seen that the trios of LEDs are not determined by serial progression of their location in the V-configuration, but rather that the combined illumination of the trio substantially fills the window 24 and expands therefrom to form a fan of light to facilitate detection of bar codes which are wider than the window itself.

Figure 2B:
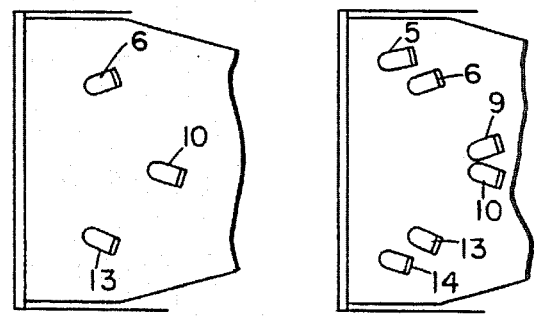
Figure 2C:
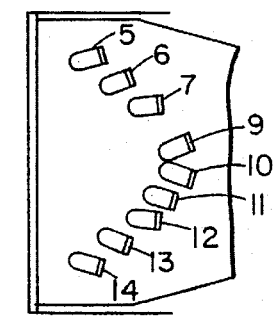
Figure 3:
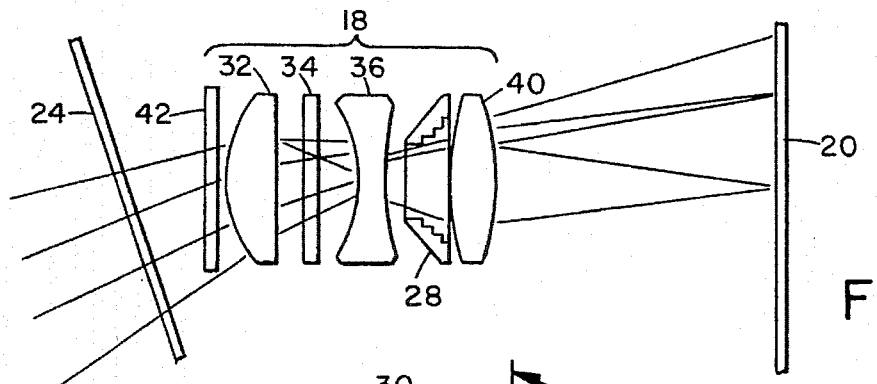
FIG. 3 is an exploded view of the lens assembly.

In FIG. 2a, LEDs 6, 10 and 13 make up the first trio. Light rays 106, 110 and 113, shown in FIG. 1, fill a substantial portion of the window 24. The second trio of LEDs comprises LED 5, LED 10 and LED 14, which are added to the first trio, as shown in FIG. 2b. The beams emanating therefrom, rays 105, 110 and 114, shown in FIG. 1, supplement rays from the first trio to fill window 24 and expand therefrom. FIG. 2c illustrates the location of the third trio consisting of LEDs 7, 11 and 12. Rays 107, 111 and 112 emanate therefrom to supplement the light from the first two trios. The fourth trio is made up of LEDs 4, 8 and 15 with their respective rays 104, 108 and 115. The specific LEDs included within a given trio are variable as long as the resultant fan of light substantially fills the window 24. As will be described below, the designated trios may be sequentially illuminated in order to conserve the energy of the power source. The configuration having twelve LEDs can also be divided into two sextets, in which two trios are combined in each sextet. Similarly, if 24 LEDs are used, the groupings can be in multiples of six or twelve. The grouping of the LEDs is significant when sequential or graduated illumination is used.

Figure 11:
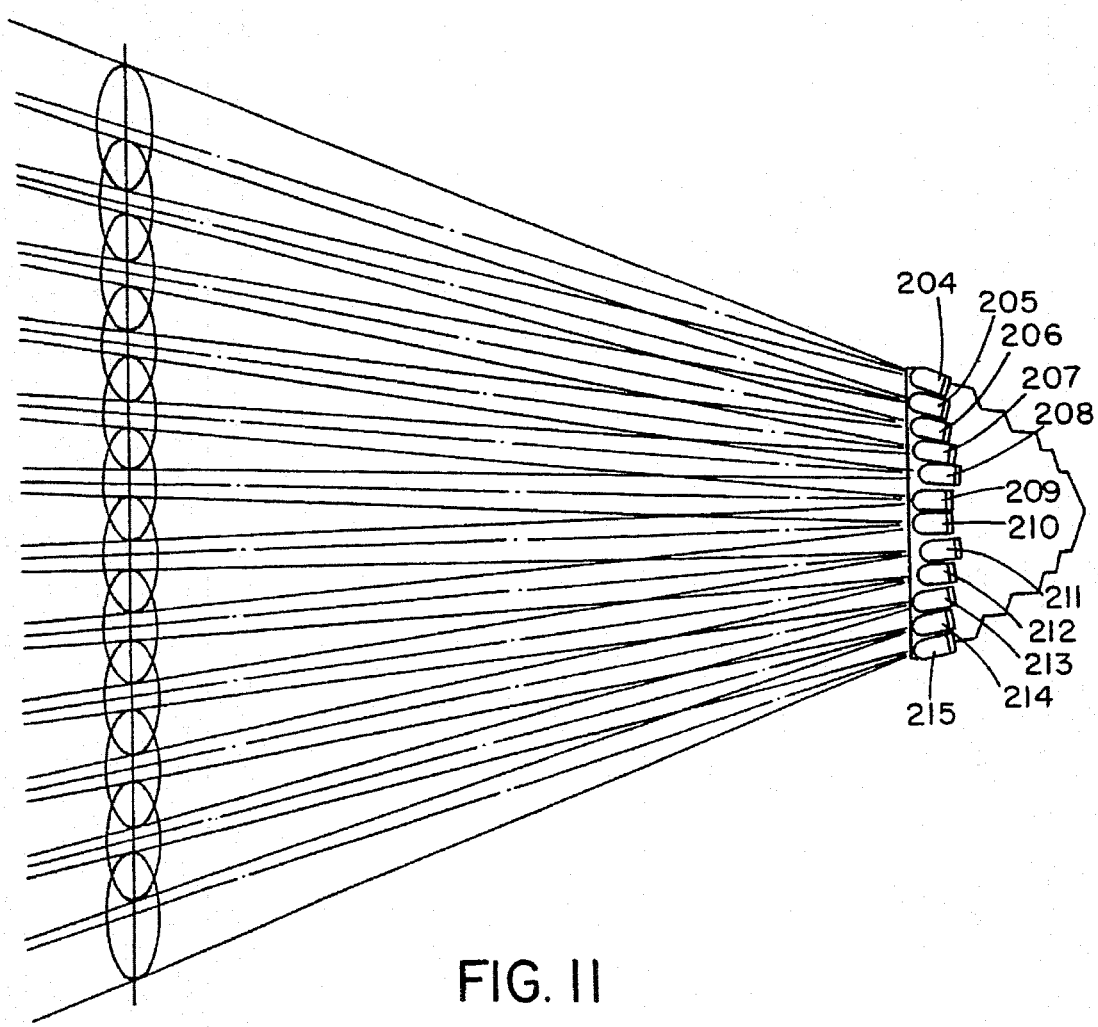
FIG. 11 is a diagrammatic view of a third alternate LED layout and its corresponding light distribution.

An alternate configuration for arrangement of the LEDs is a generally straight line across the front of the board, as illustrated in FIG. 11. The fan of light is created by orienting the LEDs at different angles. In the straight line configuration, the centermost LEDs 209 and 210, are turned to point away at an angle of 1.625 degrees from a line normal to the front of the board. Progressing outward, each LED is 3.25 degrees from its inner adjacent LED.

The LEDs are selected so that they emit light at the wavelength of 660 nanometer, red light within the visible spectrum. This wavelength provides optimal contrast for bar code scanning applications in which dark and light bars must be distinguished. Infrared light also provides enhanced contrast, so that LEDs emitting light outside of the visible spectrum may be used.

The optic module 17 consists of three lenses mounted inside a slidable lens support 30, all of which are retained within dark room 16. The selection of the three lenses of which the lens assembly 18 is formed depends upon the desired reference plane, i.e., the desired depth of field, which is the distance between the detector 20 and the bar code being scanned, so the reflected light is appropriately focused on the detector array. The lens assembly 18 consists of a plano-convex lens 32 followed by a bandpass filter 34, a biconcave lens 36 followed by an optical diffuser 28 and a focussing and receiving singlet lens 40. In the prototype model, the lens focal lengths were selected to be 10.69 mm for lens 32 and 7.49 mm. Lens 40 is important to the success of the invention since it determines the beam diameter impinging upon the detector array, and concentrates the beam to provide the maximum available light. In the prototype device, the forward focal length of lens 40 was 18.68 mm, and the back focal length was 16.68 mm. The lenses may be coated with an anti-reflection coating and/or a pass-band coating to minimize reflectance at the interfaces between the adjacent lenses and at the ends of the lens assembly.

The optimum depth of field can be adjusted by moving the lens assembly forward or backward in its slidable mounting 21 with respect to the detector. This will modify the focal point on the detector so that it can be fine tuned for a desired scanning height.

A spatial filter may be included within the optical module, disposed adjacent to or even integral with the lens assembly 18. The spatial filter 42 is an air slit with an orientation and configuration corresponding to the shape of the bar code being scanned. Specifically, the slit is oriented vertically so that it is parallel to vertical bars of the bar code and has dimensions on the order of 5 millimeters high by one millimeter wide. The light absorber/diffuser 28 is in the form of a funnel having an aperture on the order of 4.5 millimeters with its wider end facing towards the detector end of the lens assembly. The funnel allows absorption and concentration of light diffracted from the edges of the lenses. The bandpass filter 34 serves to block any radiation which falls outside of a wavelength range centered around 660 nm (or wavelengths surrounding infrared light for the infrared scanner). For the visible light system, it is particularly desirable to filter the infrared and other visible portions of the light spectrum which may reach the window from the sensing region to provide optimal contrast. This improves resolution of bar codes read at a distance shorter than the depth of field.

The window 24 consists of a bandpass filter centered at approximately 660 nm (for the visible light scanner) and a light equalizer/diffuser, and may be combined with, or separate from, a cylindrical lens 38, which focuses the light along one axis to form a plane of light, with a line of light being created at its focal point, which is approximately 7 inches. When the bar code is scanned at the precise focal point of the cylindrical lens 38, the maximum possible light will be reflected to the detector. The window's function is to suppress radiation noise from the LEDs, to form a homogeneous incident beam for illumination of the bar code, to collimate the beam, and to filter the reflected light by removing extraneous light which falls outside of the predetermined acceptable bandwidth range of 660 nm.

The detector 20 consists of an array of charged coupled devices (CCD) which are arranged in equally spaced pixels. The spacing of the pixels determines the limit of the resolution of the detector, so it is necessary to match the CCD resolution to the required spatial resolution in the image plane in which the detector lies. The magnification of the lens system should be chosen so that at least 2 CCD pixels cover the minimum bar width to be resolved in the image plane. This is especially important for bar codes printed with a dot matrix printer.

Figure 7A:
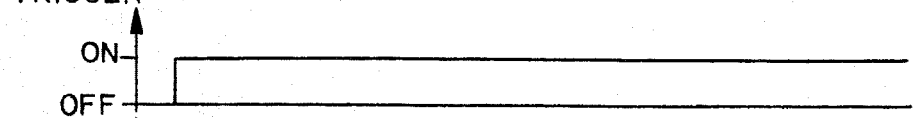
FIGS. 7a through 7g are plots of clock pulses for different timing configurations with respect to activation of the scanner (FIG. 7a); alternate illumination cycles (FIGS. 7b, 7c and 7d) according to the present invention; analog reset of the detector (FIG. 7e); and illumination patterns according to prior art methods 1 and 2 (FIGS. 7f and 7g)
Figure 7B:
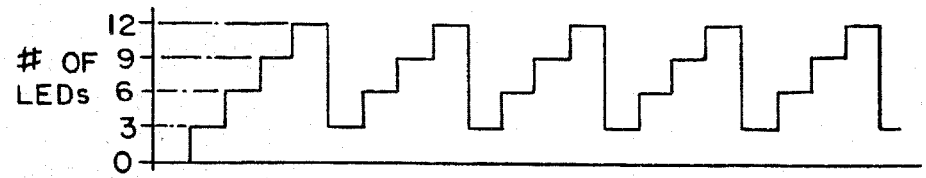
Figure 7C:
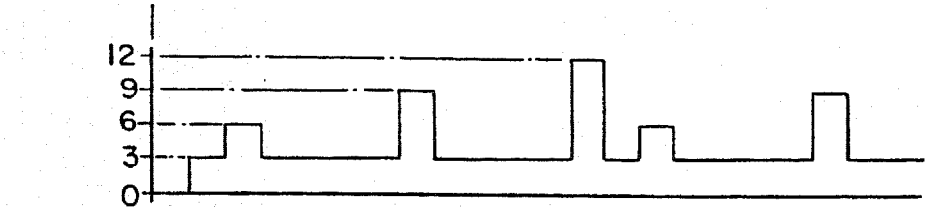
Figure 7D:
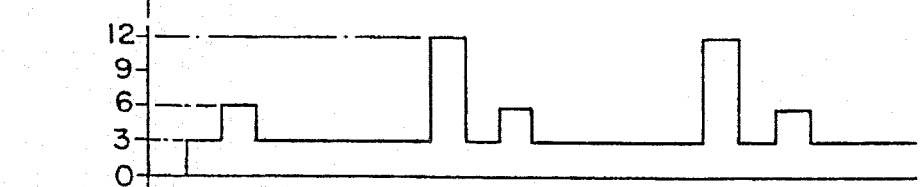
Figure 7E:
Figure 7F:
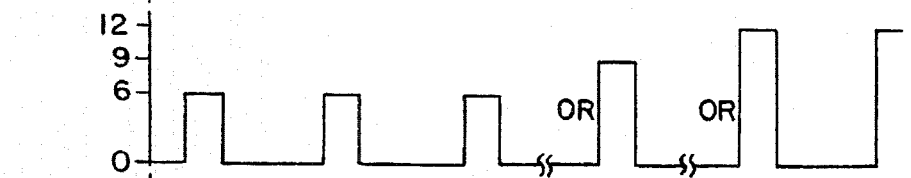
Figure 7G:
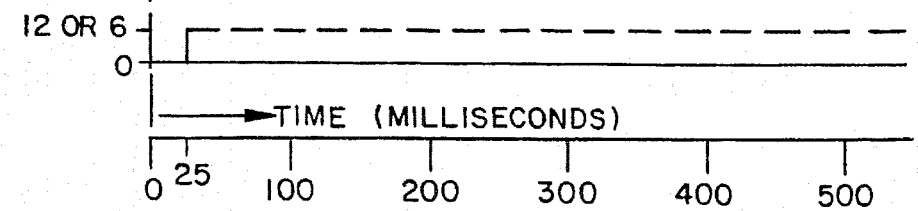

Electrical power is provided to the CCD array by D.C. source or battery 46. In a first embodiment of the invention, the supply of power to the CCD array is coordinated by a clocking signal with the sequential or graduated illumination of the LEDs. Specifically, as seen in FIG. 7e, a clock signal (from clock 50) is provided to the CCD array to clear it in coordination with the activation of the LEDs. The CCD array can be scanned at a variable rate, from 36 to 200 scans per second, with the rate being determined by the density of the bar codes being scanned. The scan rate is set by the system clock which then modifies the illumination sequence of the LEDs so that the coordination illustrated in FIGS. 7a–7e will be maintained. The determination of scan rate can be preprogrammed and can be initiated by scanning a bar code with the scanning rate set-up information, or other relevant information, prior to measurement of the bar codes of interest.

Figure 8:
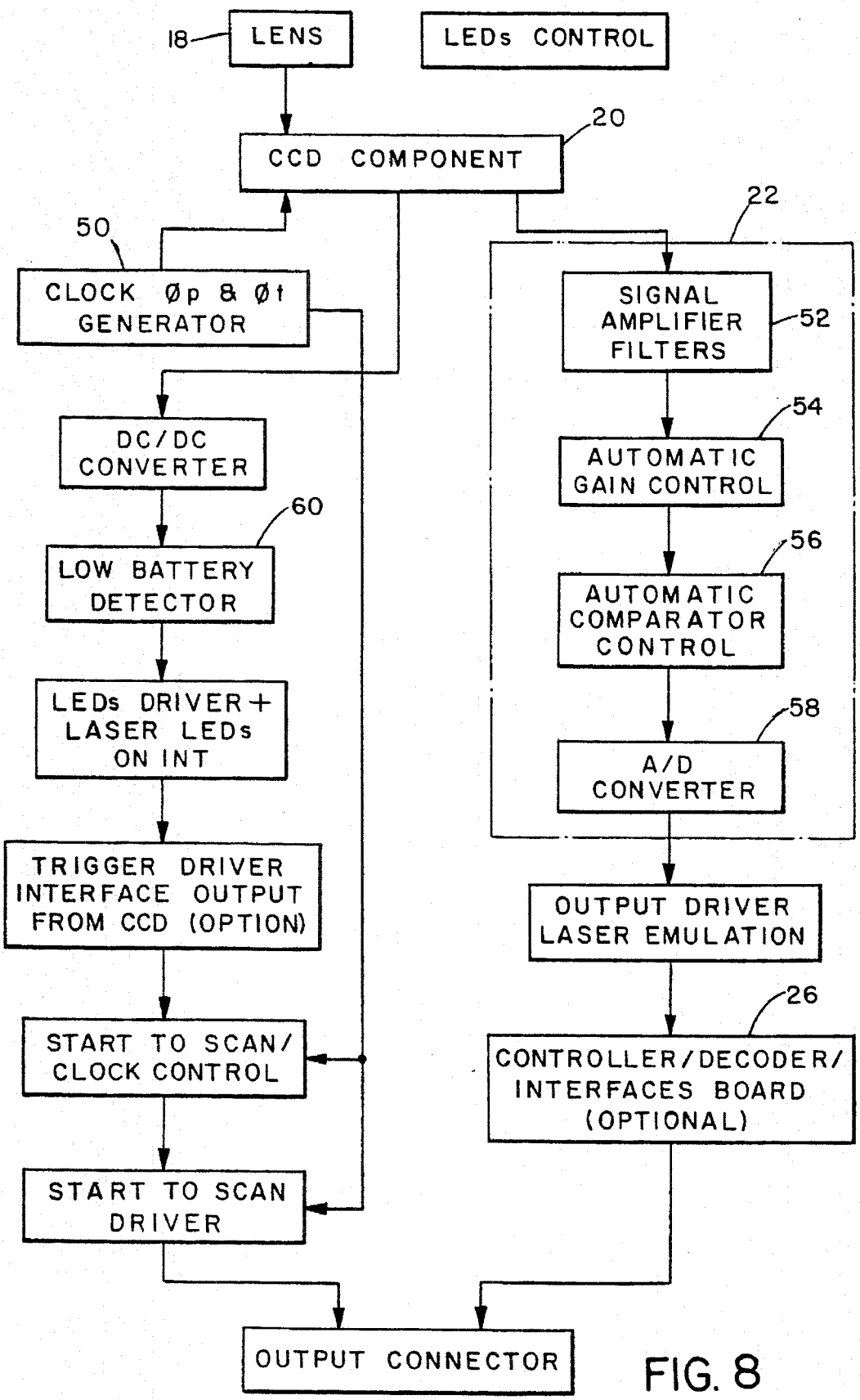
FIG. 8 is a block diagram of the operational sequence of the optical scanning head according to the present invention.
Figure 12:
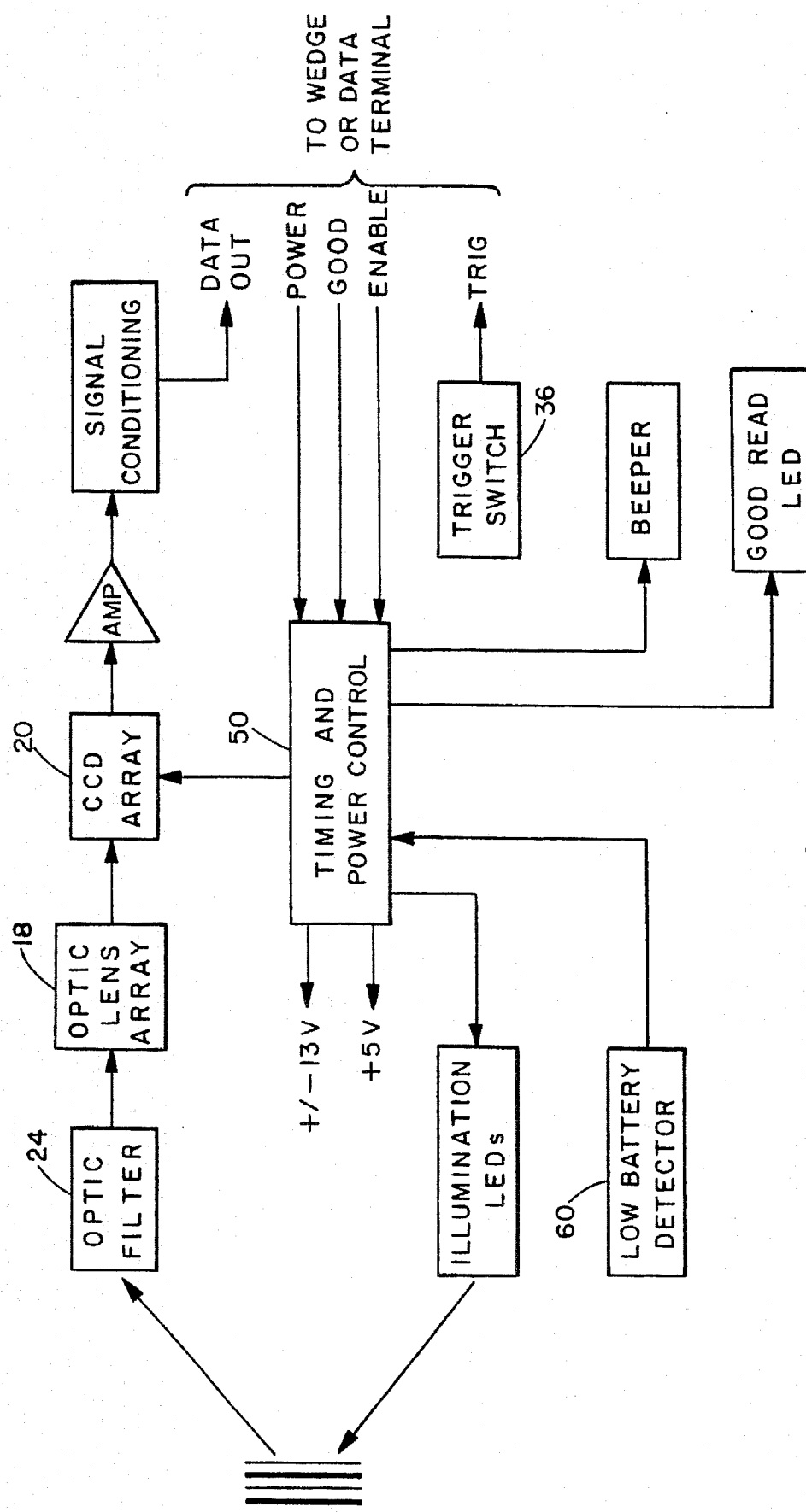
FIG. 12 is a block diagram of the scanning sequence.

The processing sequences are shown in FIGS. 8 and 12. The signal provided by the CCD array will be amplified then processed through a low pass two pole filter and a high pass (25 KHz–30 KHz) five pole filter (shown combined as filter 52) which will extract the useful signal any noise generated either by the incoming light or by the CCD array itself. An optional automatic gain control (AGC) 54 will adjust the level of the signal to a pre-determined level. The level of the signal entering the AGC is a function of the distance at which the bar code is scanned. The greater the distance that the scanner is held above the scanned code, the weaker the signal will be. A filtered signal will then provide a voltage to a circuit which determines the real time center point ("zero crossing") reference level to a comparator with a gain of 500,000 which will convert the analog video output signal to a digital signal representing the bar code. The use of an automatic comparator control (ACC) 56 will avoid noise generated by hysteresis and will avoid missing the white guard and the first commutation which represents the first bar in the video signal. The signal is then converted from analog to digital by A/D converter 58 and sent to decoder 26.

In an alternate embodiment, rather than sequentially illuminating the LEDs, the voltage to the LEDs is regulated in response to the signal level in the detector. The stronger the received signal, the lower the intensity of light required from the LEDs. The strength of the signal is dependent upon the distance between the scanner and the bar code, so, at the maximum scanning distance, the LEDs will receive full power. This conserves power by only demanding the power that is necessary. It also avoids saturating or distorting the detected signal if the bar code is read at a short distance from the scanner with high intensity light.

Figure 6:
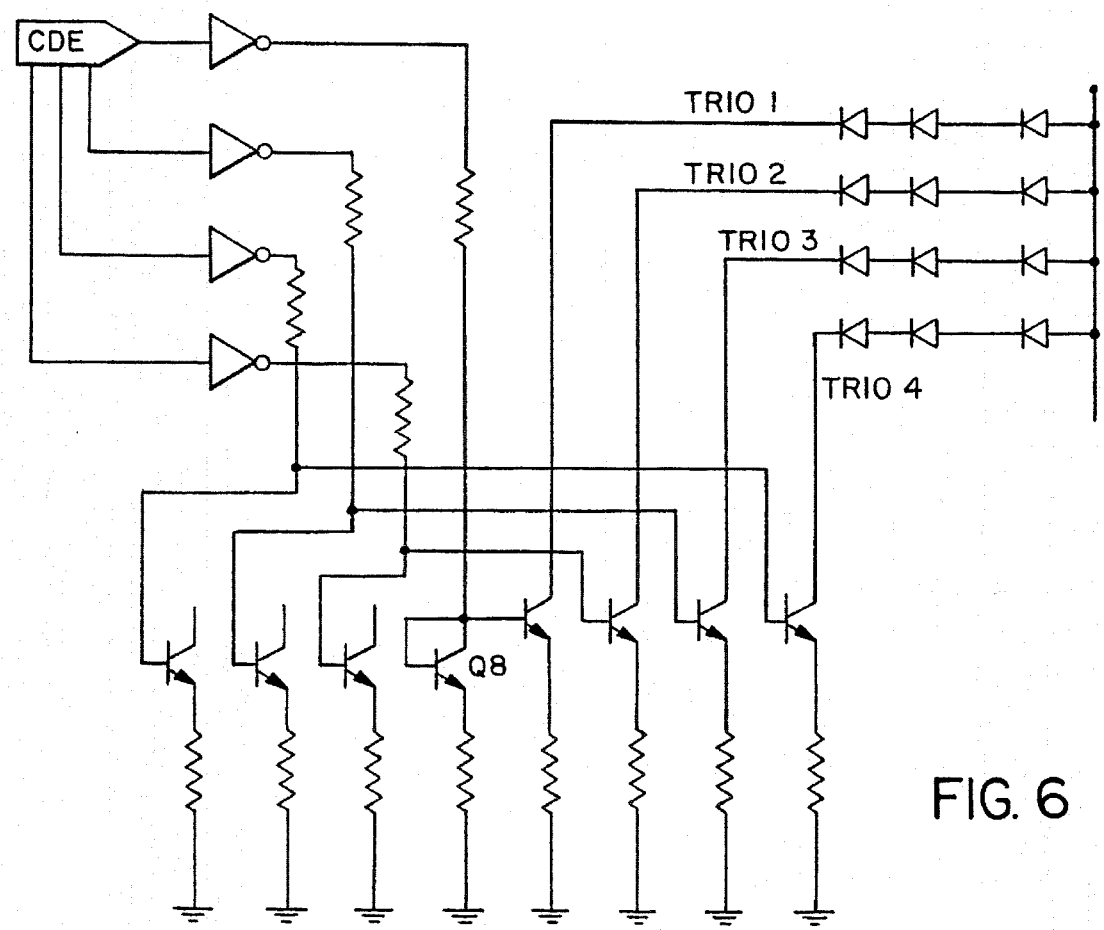
FIG. 6 is a circuit diagram of the LED board for the 12 LED configuration of FIG. 1.

The optical scanning head of the present invention provides for conservation of power supply energy by using a system clock to control a scanned, progressive illumination of the LEDs in coordination with clearing of the CCD array. The circuit diagram in FIG. 6 is provided to illustrate the sequential control of the four different LED trios which are illustrated in the embodiment of FIG. 1. For example, the clock driver provides a signal to activate amplifier U2A which then provides a signal to the first trio, identified as TRIO 1, to illuminate LEDs 5, 6 and 12. TRIO 1 is connected so that it will be on at all times that the scanner is activated, regardless of which other trios are on (note the base-collector short at transistor QS).

FIG. 7 provides samples of pulse patterns for activation of the LEDs of the embodiment illustrated in FIG. 1. FIG. 7a illustrates the activation of the scanner at the beginning of a first clock pulse, i.e., the power is turned on. According to the pulse pattern illustrated in FIG. 7b upon application of the "turn on" signal, first trio of LEDs (TRIO 1) is illuminated. At the beginning of the second clock cycle a second trio (TRIO 2) is illuminated. Also at this time, a signal is provided to the CCD array to reset it to initiate its detection function, shown in FIG. 7e. At the beginning of the third clock cycle a third trio of LEDs (TRIO 3) turns on, and during a fourth clock cycle a fourth set of LEDs (TRIO 4) turns on. During the fifth clock cycle TRIO 2, TRIO 3 and TRIO 4 turn off and only TRIO remains on. This step up/drop down sequence is continued until the trigger is turned off at the point illustrated in FIG. 7a. In FIG. 7c a second possible pulse pattern is illustrated in which the first trio of LEDs turns on during the first clock cycle and a second LED trio turns on the second clock cycle, then turns off in the third clock cycle so that the first trio remains on until the seventh clock cycle when the second and third trios turn on for a single clock cycle. The first trio of LEDs remains on during the entire procedure and in the twelfth clock cycle, all four trios of LEDs turn on for one cycle. After a single clock cycle, where only the first set of LEDs remain on, the sequence repeats. In FIG. 7d the pulse pattern alternates between two trios of LEDs being on and turning on four trios of LEDs, with one trio being on at all times. For comparison of the inventive method to prior art practices, FIGS. 7f and 7g are provided. In FIG. 7f, a simple alternation occurs between on and off. In FIG. 7g, any combination of the LEDs remains on at all times that the trigger is activated.

Figure 9:
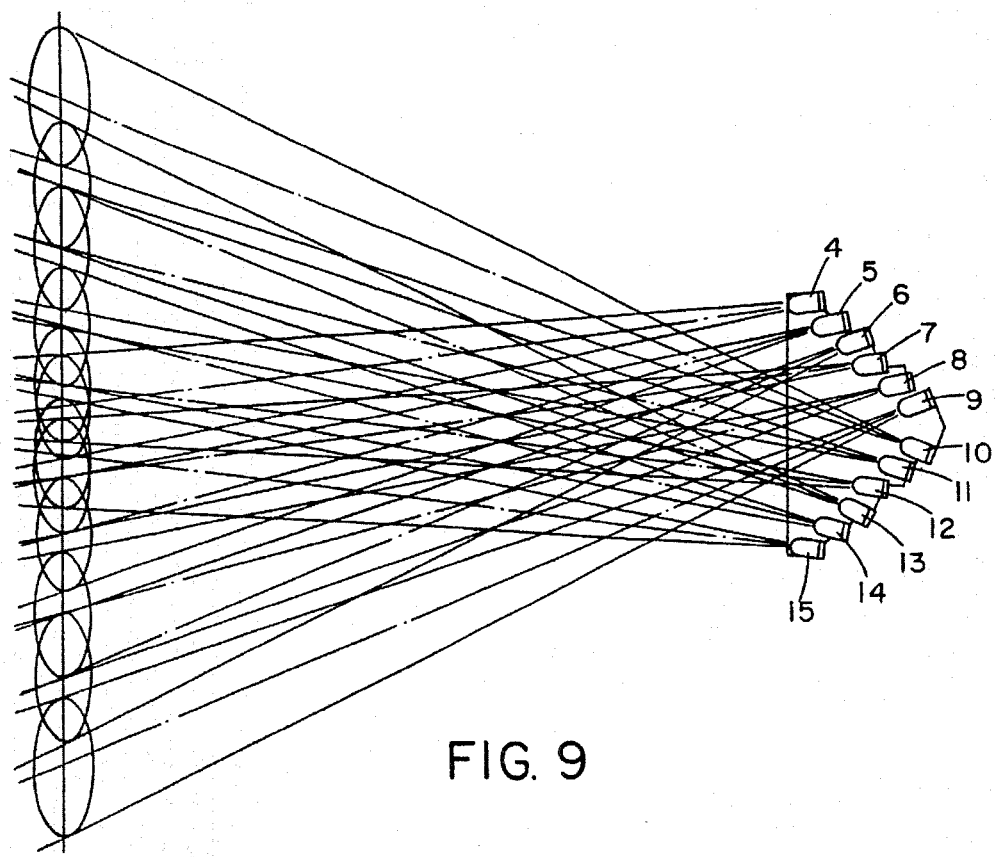
FIG. 9 is a diagrammatic view of an alternate LED layout and the corresponding light distribution.

In an alternate embodiment, power conservation is achieved by regulating the voltage supplied to the LEDs in response to the level of the signal generated by the detector array. As above, the detector signal level is dependent upon the distance at which the bar code is scanned. For greater distances, the signal level will be lower. In response to this lower signal, the voltage supplied to the LEDs will be increased. When the signal level is above a pre-determined limit, the voltage supplied to the LEDs will be less, since less light is needed to provide an acceptable signal. As an example, if the bar code is read at close range, the LEDs will be supplied with a 25% of the maximum current drain, which, in the prototype device, is 5 mA. If the bar code is read within the middle of the total field depth, the LEDs receive 50%, or 10 mA. At the outer limits of the field depth, the supplied current will be 20 mA. The percentage of power applied to the LEDs may change with the color of the bar code as needed to obtain the optimal light intensity for scanning. This power management technique will use the level of the video output signal to command and control the current on the LEDs through an appropriate clocking function The light path of the incident beam at the front region of the scanner will generate a beam of light through angular distance over a field of view across the bar code symbol located in the vicinity of the reference plane. The width of the light transmissive window 24 represents a limiting factor for the width of the incident beam. For this reason, the LEDs are mounted as close as possible to the window 24 to optimize the field of view and the incident beam power. Despite this limitation, the field of view of the incident beam is generally independent of the width of the PCB 2 or of the housing. This permits the field of view, i.e., the transverse beam dimension of the incident beam to be larger than the width of the window 24. This is due to the fact that the LEDs emit the incident beam at different directions from each side of the device within the scanning head. The LEDs are oriented to provide parallel beams in pairs. For example, a first pair of LEDs, LEDs 4 and 7 are oriented at a 7.5° angle on the y-axis (a line normal to the front of the PCB 2), 5 and 8 are oriented at 15°, and LEDs 6 and 7 are oriented at 22.5°, as illustrated in FIG. 9. The LEDs on the other leg of the "V" are similarly oriented in the opposite direction. As can be seen in the figure, the fan of light which results from this orientation provides an intensity distribution which is higher within a narrow region at the center of the fan, as determined at a distance of 7 inches from the scanner.

Figure 10:
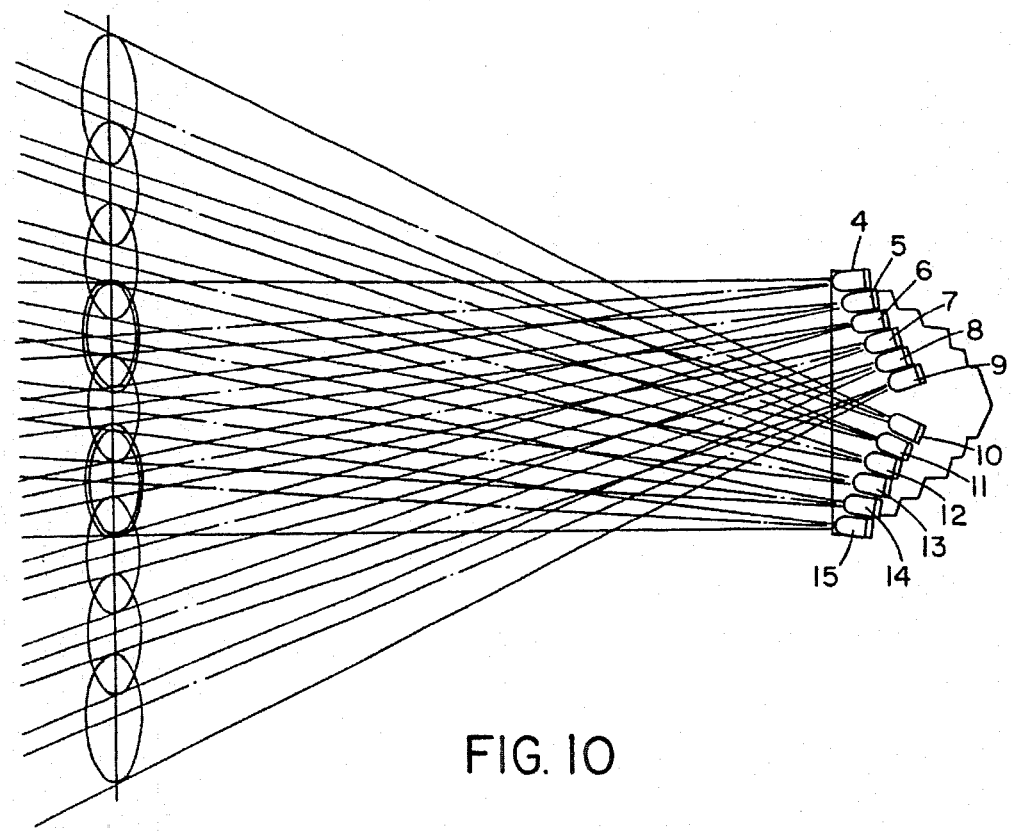
FIG. 10 is a diagrammatic view of a second alternate LED layout and its corresponding light distribution.

The alternate LED arrangement shown in FIG. 10 places the centermost LEDs at an angle of 3.75 degrees from a line normal to the front of the scanner, with the other LEDs being oriented at 3.75 degree increments as they progress outward along the legs of the "V". This LED configuration results in a slightly wider region of higher intensity as compared to the above-described embodiment.

A third configuration of the LEDs is illustrated in FIG. 11, which shows a line of LEDs at varying orientations. This configuration is described above.

Other electrical sub circuits can also be provided on PCB 2, including the analog filter 52 and a/d converter 58. However, in order to configure the housing of the scanner in desired position, it may be necessary to provide a second circuit board oriented at some angle to the first circuit board onto which additional subcircuits can be placed including a decoder chip and a memory device. For example, two circuit boards can be configured so that one abuts the other at approximate right angles to create an "L"-shaped arrangement. This arrangement would allow placement of one of the boards in the barrel of a scanning gun with the other board extending partially into the handle portion.

The decoder module 26 may be either inside or outside of the scanning head housing and will process the digitalized signal generated in the scanning head to calculate the desired data, e.g., the multiple digit representation or code represented by the bar code symbol in accordance with the algorithm contained in the software program. The decoder module includes a random access memory (RAM) for temporary data storage, and EPROM or PAL for holding the control program and a microprocessor which controls the RAM and EPROM or PAL. The decoder module will also include circuitry for controlling the scanning head and the communication circuitry for communication with different functions of the scanning head or with a host system to which the scanning head can be connected, such as a hand held terminal data screen personal computer for computer network.

A low battery detector 60 is included in the housing to provide an indication of insufficient power for further scans. This will provide advance warning so that the user will be aware of the problem before having scanned a number of items without realizing that the items cannot register properly due to the insufficient power.

Figure 4:
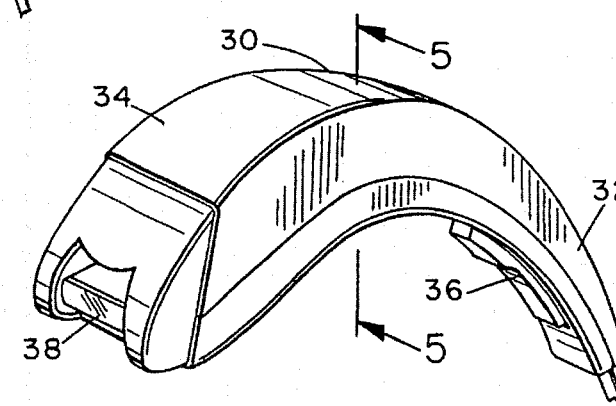
FIG. 4 is a perspective view of an assembled optical scanning head including a housing.
Figure 5:
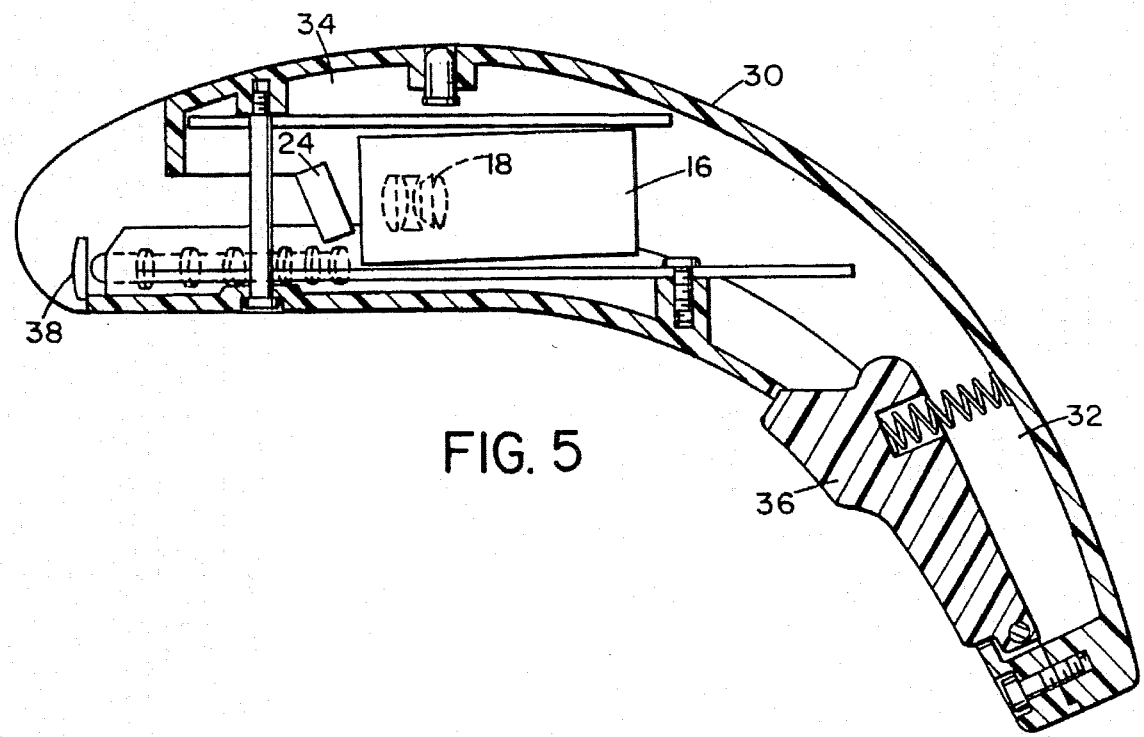
FIG. 5 is a cross-sectional view along line 5—5 of FIG. 4.

The circuitry, with or without the power supply of a portable configuration, of the optical scanner is protected within a housing 30 which is contoured to easily fit into the user's hand. The user will grip the housing 30 by its handle portion 32, illustrated in FIGS. 4 and 5, with the window portion 34 aimed at the bar code symbol to be read. The trigger 36 is built within the handle 32 for easy, one-handed operation of the scanner, with the trigger being positioned at a short distance from the user's fingers so that activation is simply a matter of depressing the trigger. The window portion can be placed anywhere from 0 to 22 inches above or in front of the bar code to be scanned. With a scanning distance of less than seven inches, it is desirable to center the fan of light over the bar code since different brightnesses due to the sequential limitation of the LEDs may illuminate some portions of the bar code more brightly than others, and due to the higher density of light at the center of the fan.

The optical scanning head of the present invention provides a device for building a small or self-contained portable device, a portable component of a multi-component scanner, or the optical portion of a built-in scanning unit, for bar code scanning which uses LED and CCD technology making it an economical device. The scanning head is capable of reading bar codes up to 22 inches away from the detector so that it is versatile for either portable or fixed implementation. The variably pulsed activation of the LEDs and CCD array, or the graduated illumination of the LEDs, makes the device capable of operating at low power with minimal power drain during illumination, a significant factor in portable scanners. The lens system and fan of light produced by the LED array permit the reading of wide range of bar code densities and widths.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. An optical scanner for reading and decoding information encoded in a bar code comprising alternating lines of light and dark, said optical scanner comprising:

a printed circuit board having a front, a center and a rear;

an array of light emitting diodes comprising at least one combination of light emitting diodes disposed at said front of said printed circuit board in an arrangement wherein each light emitting diode of said at least one combination emits light at a non-zero angle with respect to a centerline bisecting said printed circuit board from said front to said rear so that a fan of light is projected from said array toward a reference plane within a field of view containing said bar code so that light is reflected therefrom;

an optical assembly disposed at a center of said printed circuit board for receiving, concentrating and directing reflected light toward said rear of said board;

a CCD array disposed at said rear of said printed circuit board for detecting a portion of said reflected light directed thereon by said optical assembly and generating an electrical signal in response thereto wherein said electrical signal is an analog representation of said bar code;

a conversion assembly for receiving and converting said electrical signal into a digital signal corresponding to said bar code; and a voltage source for providing a driving voltage to said array of light emitting diodes, said CCD array and said conversion assembly.

2. An optical scanner as in claim 1 wherein said array of light emitting diodes comprises at least two combinations of light emitting diodes and further comprising:

a clocking device for controlling a transfer of driving voltage from said voltage source to each combination of light emitting diodes wherein a first said combination remains on when said optical scanner is activated and at least one second said combination is periodically turned on and off according to a clocking signal generated by said clocking device.

3. An optical scanner as in claim 1 further comprising:

a clocking device for controlling transfer of driving voltage from said voltage source to said at least one combination of light emitting diodes; and a gain controller responsive to a level of said electrical signal for controlling a level of driving voltage applied to said at least one combination of light emitting diodes.

4. An optical scanner device as in claim 3 wherein said gain controller ramps up said level of said driving voltage when said optical scanner is at a greater distance from said bar code.

5. An optical scanner as in claim 1 wherein said field of view has a depth in the range of 0 to 22 inches.

6. An optical scanner as in claim 1 wherein said array of light emitting diode is disposed in a generally V-shaped arrangement.

7. An optical scanner as in claim 1 wherein said array of light emitting diodes is disposed in a generally straight row across said front of said printed circuit board.

8. An optical scanner as in claim 1 wherein said optical assembly comprises a plurality of lenses and filters for optimizing said reflected light for detection by said CCD array.

9. An optical scanner as in claim 1 wherein each light emitting diode of said array emits visible red light.

10. An optical scanner as in claim 9 wherein said visible red light has a wavelength of 660 nanometers.

11. An optical scanner as in claim 1 wherein each light emitting diode of said array emits infrared light.

12. An optical scanner as in claim 8 wherein said optical assembly includes a bandpass filter for blocking light having a wavelength outside of a range around a pre-determined wavelength at which said array of light emitting diodes emits.

13. An optical scanner as in claim 1 further comprising a window disposed at said front of said printed circuit board for filtering said fan of light and said reflected light.

14. An optical scanner as in claim 1 wherein said conversion assembly includes an automatic gain control for controlling gain in response to a detected intensity level of said reflected light.

15. An optical scanner as in claim 2 wherein said clocking device further controls a timing of scanning of said CCD array and a transfer of said electrical signal to said conversion assembly.

16. An optical scanner as in claim 1 wherein said optical assembly further comprises a light shield to block out stray light.

17. An optical scanner as in claim 1 wherein said optical assembly is slidable in a direction running from said front to said rear of said printed circuit board to permit variation in a depth of field of said optical scanner.

18. An optical scanner as in claim 1 wherein said CCD array has a density of elements selected according to a density of said alternating lines of said bar code.

19. An optical scanner as in claim 1 wherein said fan of light has an intensity distribution which is denser at a center of said fan.

20. An optical scanner as in claim 1 further comprising a housing for hand-held operation.

21. An optical scanner as in claim 20 further comprising a trigger for activating and de-activating said optical scanner.

22. An optical scanner as in claim 1 further comprising means for indicating a drain of said voltage source.

23. An optical scanner as in claim 1 further comprising a cylindrical lens disposed in front of said array of light emitting diodes for creating a line of light at a focal point of said cylindrical lens.

24. An optical scanner for scanning a bar code symbol having a first width, said optical scanner comprising:

at least one printed circuit board having a front, a center, a rear and a longitudinal centerline bisecting said at least one printed circuit board into a first side and a second side, said front having a second width smaller than said first width;

a plurality of LEDs disposed on said front of said at least one printed circuit board for emitting an incident beam of light for illuminating said bar code symbol, a first portion of said plurality of LEDs being disposed on said first side and a second portion of said plurality of LEDs being disposed on said second side, each of said first portion and said second portion of LEDs being oriented to emit light at a non-zero angle with respect to said centerline so that a first half of said incident beam emitted by said first portion of LEDs intersects a second half of said incident beam emitted by said second portion of LEDs wherein said incident beam of light has a beam width which increases at increasing distances from said front of said at least one printed circuit board;

an optical focusing means disposed at said center of said at least one printed circuit board for focusing light;

a detector means disposed at said rear of said at least one printed circuit board for detecting light focussed by said optical focussing means and generating an electrical signal representative of said bar code symbol therefrom;

a signal processing means in electrical communication with said detector means for converting said electrical signal into an output comprising data descriptive of said bar code symbol; and a voltage source for providing voltage to said plurality of LEDs, said detector means and said signal processing means.

25. An optical scanner for scanning a bar code symbol having a first width, said optical scanner comprising:

a housing for hand-held operation having a second width at a front end at which an incident beam of light for illuminating said bar code symbol exits said housing, said second width being smaller than said first width, said housing having a handle portion having dimensions for being held in a user's hand;

at least one printed circuit board retained within said housing and having a front corresponding to said front end of said housing, a center, a rear and a longitudinal centerline bisecting said printed circuit board into a first side and a second side;

a plurality of LEDs disposed on said front of said at least one printed circuit board, a first portion of said plurality of LEDs being disposed on said first side and a second portion of said plurality of LEDs being disposed on said second side, said first portion of LEDs and said second portion of LEDs being positioned on either side of said centerline so that said plurality of LEDs emits a diverging incident beam of light beyond said front end;

an optical focusing means disposed at said center of said at least one printed circuit board for focusing light;

a detector means disposed at said rear of said at least one printed circuit board for detecting light focused by said optical focusing means and generating an electrical signal representative of said bar code symbol therefrom;

a signal processing means for converting said electrical signal into an output comprising data representative of said bar code symbol; and a voltage source for providing voltage to said plurality of LEDs, said detector means and said signal processing means;

wherein said optical scanner is held at a distance from said bar code symbol and said diverging incident beam of light has a width at least as wide as said first width at a point at which said diverging incident beam of light contacts said bar code symbol.

26. An optical scanner as in claim 25 further comprising a trigger disposed on said housing adjacent said handle portion for activating and deactivating said optical scanner.

* * * * *